United States Patent [19]

Shih et al.

[11] Patent Number: 4,622,536
[45] Date of Patent: Nov. 11, 1986

[54] RATIO INDEPENDENT CYCLIC A/D AND D/A CONVERSION USING A RECIPROCATING REFERENCE APPROACH

[75] Inventors: Cheng-Chung Shih, Albany; Paul R. Gray, Orinda, both of Calif.

[73] Assignee: Regents of the University of California, Berkeley, Calif.

[21] Appl. No.: 655,642

[22] Filed: Sep. 28, 1984

[51] Int. Cl.$^4$ .................... H03M 1/06; H03M 1/40
[52] U.S. Cl. .................. 340/347 DA; 340/347 AD; 340/347 SH
[58] Field of Search ..... 340/347 C, 347 SH, 347 AD, 340/347 DA; 307/352, 353

[56] References Cited

U.S. PATENT DOCUMENTS 3,251,052  5/1966  Hoffman et al. ............ 340/347 C
4,119,960 10/1978  Hill ............................ 340/347 AD Primary Examiner—L. T. Hix
Assistant Examiner—David M. Gray
Attorney, Agent, or Firm—Fliesler Dubb Meyer & Lovejoy

[57] ABSTRACT

An algorithmic analog-to-digital and digital-to-analog converter 10 combines the techniques of switched capacitor cyclic conversion by using first and second amplifiers 31, 32 with capacitors $C_1$, $C_1'$, $C_2$, $C_2'$, $C_3$, $C_3'$, $C_4$, $C_4'$, $C_5$, $C_5'$ communicating with the inputs of said amplifiers 31, 32 and between the inputs and outputs of said amplifiers 31, 32, and the techniques of reference voltage refreshing. The performance of the converter 10 is capacitor ratio-independent. Because of the ratio-independent aspect, very small component values can be used, and as a result, the die area required for the circuitry can be quite small.

15 Claims, 3 Drawing Figures

RATIO INDEPENDENT CYCLIC A/D AND D/A CONVERSION USING A RECIPROCATING REFERENCE APPROACH

BACKGROUND OF THE INVENTION

The present invention relates to analog-to-digital conversion and digital-to-analog conversion using a switch capacitor technique.

BACKGROUND OF THE ART

Previously described approaches to digital-to-analog and to successive-approximation analog-to-digital conversion have relied on circuit techniques which required the matching of on-chip precision passive components to an accuracy comparable with the integral non-linearity required in the converter. R-2R ladders, resistor strings, and capacitor array digital-to-analog converters (DACs) fall into this category. The realization of the required matching has typically required laser trimming or other form of trimming in order to achieve non-linearity smaller than 0.2 percent. Recently a new technique has been described which allows the automatic calibration of a capacitor array-based analog-to-digital converter. While very promising, this approach requires considerable complexity in implementation.

Traditional cyclic or algorithmic conversion involves voltage comparisons, reference voltage subtraction if applicable, and multiplication of the result by a factor of two. For an analog-to-digital conversion, the first step in the process is the decision as to whether the signal is in the upper or lower half of the full range. If the signal is in the upper range, the reference is subtracted from the signal, and the difference is doubled. The most significant bit of the digital output is set to one. If in the lower half, the input signal is simply doubled, and the most significant bit is set to zero. In the next cycle, the remainder of the previous cycle is used as the input, and the process is repeated. Using this process, a signal can be decoded into twelve bits if twelve iterations are used. In the digital-to-analog operation of the prior art, the least significant bit is decoded first. The reference voltage is added, depending on the digital input code, and the sum is divided by two each time. At the end of the twelve cycles, the analog output is derived from the digital code.

The principal source of error in these two conversions is offset in the loop and a loop gain which is not precisely two or one-half. If the loop gain is not precisely 2 or $\frac{1}{2}$, both integral and differential nonlinearity is introduced into the converter transfer characteristic.

These nonlinearities can be explained as follows. In the traditional switch capacitor implementation of cyclic conversion, as previously indicated, an amplifier with a gain of two or one-half is required. This is accomplished through the use of two capacitors and an amplifier. The operation of sampling and transferring the signal twice will result in multiplication of the signal by a factor of the ratio of the capacitors. If the capacitors are equal, then the gain is two. However, deviations from the equal values of the capacitors will result in conversion error. The present invention is directed to overcoming this capacitor ratio inaccuracy and other higher order errors in the conversion loop.

SUMMARY OF THE INVENTION

The present invention contemplates a new approach to the implementation of high-speed analog-to-digital and digital-to-analog conversion which achieves an absolute linearity which is independent of the matching accuracy of passive components used to implement the converter. This is achieved through the use of a modified form of algorithmic converter in which the reference voltage is circulated around the loop as well the signal, thereby cancelling the gain error in the loop in contrast to the prior art.

The reference recirculation technique can be implemented so as to give both ratio-independent analog-to-digital conversion and digital-to-analog conversion. If the reference voltage is circulated as well as the input voltage signal, the reference voltage will experience the same gain error as the signal voltage did, and thus compensation will be accomplished for the gain error.

It is to be understood that because of the ratio-independent aspect, very small capacitor values can be used, and as a result, the die area on the chip required for this circuitry can be scaled downwardly.

An embodiment of the invention includes an apparatus for analog-to-digital signal conversion and for digital-to-analog signal conversion which comprises a first means for sampling, holding and amplifying a signal and a second means for sampling, holding and amplifying a signal. The apparatus further includes a means for communicating the output of the first means to the input of the second means and for communicating the output of the second means to the input of the first means. Further, the apparatus includes means for introducing an input signal to be converted to one of said first and second means, and means for introducing a reference signal to be combined with the input signal to one of said first and second means.

The apparatus further includes control means for circulating said input signal to be converted and said reference signal to be combined with the input signal between the first means and the second means, and means for combining said signals.

DETAILED DESCRIPTION OF THE PREFERRED EMBODIMENT

Figure 1:
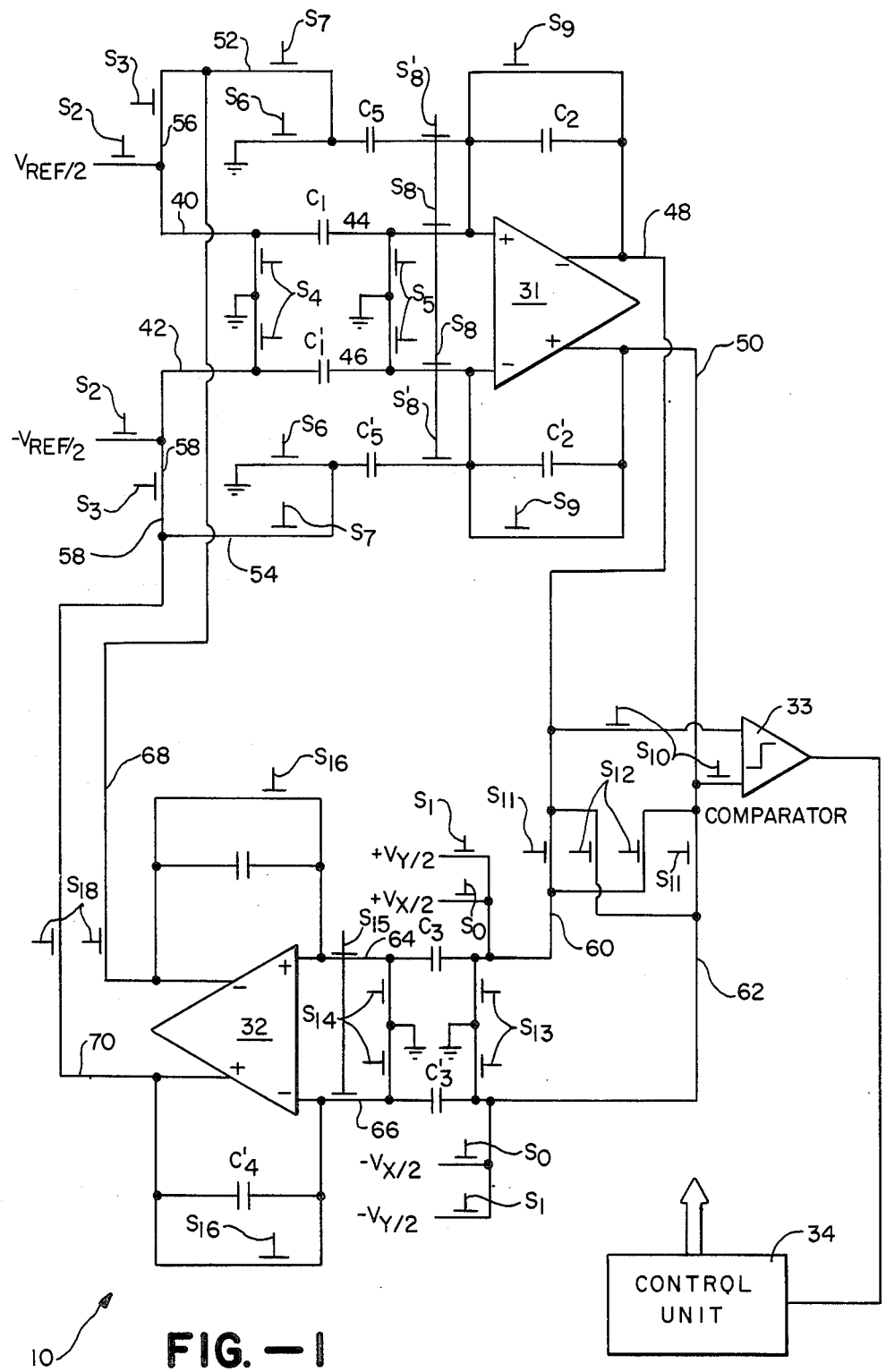
FIG. 1 is a schematic of an embodiment of the converter of the invention.

With reference to the figures and in particular to FIG. 1, an embodiment of the A/D and D/A converter 10 of the invention is depicted. The converter 10 is comprised of differential amplifiers 31, 32, comparator 33, pairs of capacitors $C_1$, $C_1'$, $C_2$, $C_2'$, $C_3$, $C_3'$, $C_4$, $C_4'$, $C_5$, $C_5'$, control unit 34 and switches $S_0$, $S_1$, $S_2$, $S_3$, $S_4$, $S_5$, $S_6$, $S_7$, $S_8$, $S_9$, $S_{10}$, $S_{11}$, $S_{12}$, $S_{13}$, $S_{14}$, $S_{15}$, $S_{16}$. In a preferred embodiment these components are implemented on a chip in MOS technology with the switches being MOSFETs. The control unit 34 can be implemented in ways that are well known in the art and is used to control the opening and closing of the switches and to control a series to parallel conversion for a digital output as is described below.

In FIG. 1, a reference voltage signal (which in this embodiment is half full scale or $V_{hfs}$) is provided as $V_{ref}/2$ and $-V_{ref}/2$ on lines 40, 42 when switches $S_2$ are closed, which lines 40, 42 are connected to capacitors $C_1$, $C_1'$ respectively and can be connected to ground by switch $S_4$. Capacitors $C_1$ and $C_1'$ are connected respectively to the non-inverting (positive) and inverting (negative) terminals of differential amplifier 31 and capacitors $C_2$, $C_2'$ by lines 44, 46 through switches $S_8$ which are provided in lines 44, 46. Lines 44, 46 are connected to ground through switches $S_5$. Lines 48, 50 communicate respectively with the negative and positive output terminals of amplifier 31. Capacitors $C_2$, $C_2'$ are connected across amplifier 31 between lines 44 and 48, and lines 46 and 50. Capacitors $C_2$, $C_2'$ can be shunted and cleared when switches $S_9$, which are provided across capacitors $C_2$, $C_2'$ are closed.

Capacitors $C_5$, $C_5'$ can be communicated with capacitors $C_2$, $C_2'$ respectively when switches $S_8'$ are closed, and with ground when switches $S_6$ are closed. Further, closing switches $S_7$ communicate capacitors $C_5$, $C_5'$ with lines 52, 54 respectively.

Output lines 48, 50 can selectively communicate through switches $S_{10}$ to comparator 33 for a digital output. Additionally, lines 50, 48 can communicate respectively with lines 60, 62 with switches $S_{11}$ closed and respectively with lines 62, 60 with switches $S_{12}$ closed.

Lines 60, 62 communicate with capacitor $C_3$, $C_3'$ respectively and can communicate with ground through switch $S_{13}$. Capacitors $C_3$, $C_3'$ communicate through lines 64, 66 with the non-inverting (positive) and inverting (negative) terminals of differential amplifier 32 when switches $S_{15}$ provided in lines 64, 66 are closed. Switches $S_{14}$ can communicate lines 64, 66 with ground.

An analog input signal $V_X/2$, $-V_X/2$ (for A/D conversion) is communicated to lines 60, 62 through switches $S_0$. Another digital reference signal $V_Y/2$, $-V_Y/2$ (equivalent to $V_{hfs}/2$, $-V_{hfs}/2$, which represents the mid-rise half least significant bit (LSB) is provided to lines 60, 62 by switches $S_1$.

Lines 68, 70 communicate with the negative and positive output terminals of amplifier 32 respectively. Lines 68 and 70 communicate with lines 52 and 58 respectively through switches $S_{18}$.

Capacitors $C_4$, $C_4'$ are communicated between lines 64 and 68 and lines 66 and 70 respectively across differential amplifier 32. Switches $S_{16}$ are provided across capacitors $C_4$, $C_4'$ and can shunt and thus clear capacitors $C_4$, $C_4'$.

For analog-to-digital conversion, the ratio $C_4/C_3$ is equal to one, and for digital-to-analog conversion, the ratio $C_4/C_3$ is equal to two. Otherwise all the capacitors have the same value.

For analog-to-digital conversion, the output is read from the output of comparator 33. Control unit 34 has a series-to-parallel converter which converts a series of bits to a word output. For digital-to-analog conversion, the output is read from the operational amplifier 31 at the end of the conversion cycle.

INDUSTRIAL APPLICABILITY

Figure 2:
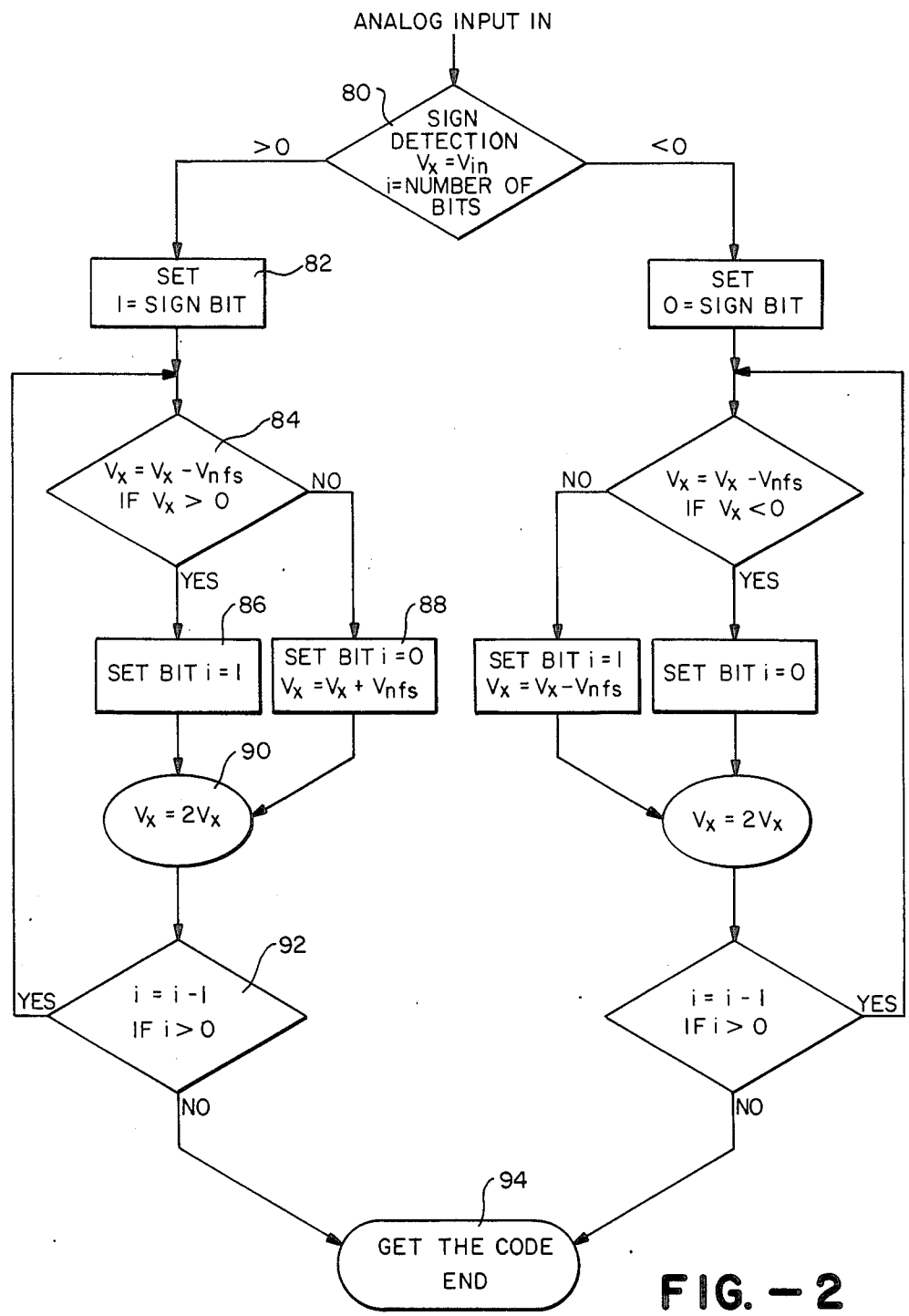
FIG. 2 is a flow diagram for analog-to-digital conversion.
Figure 3:
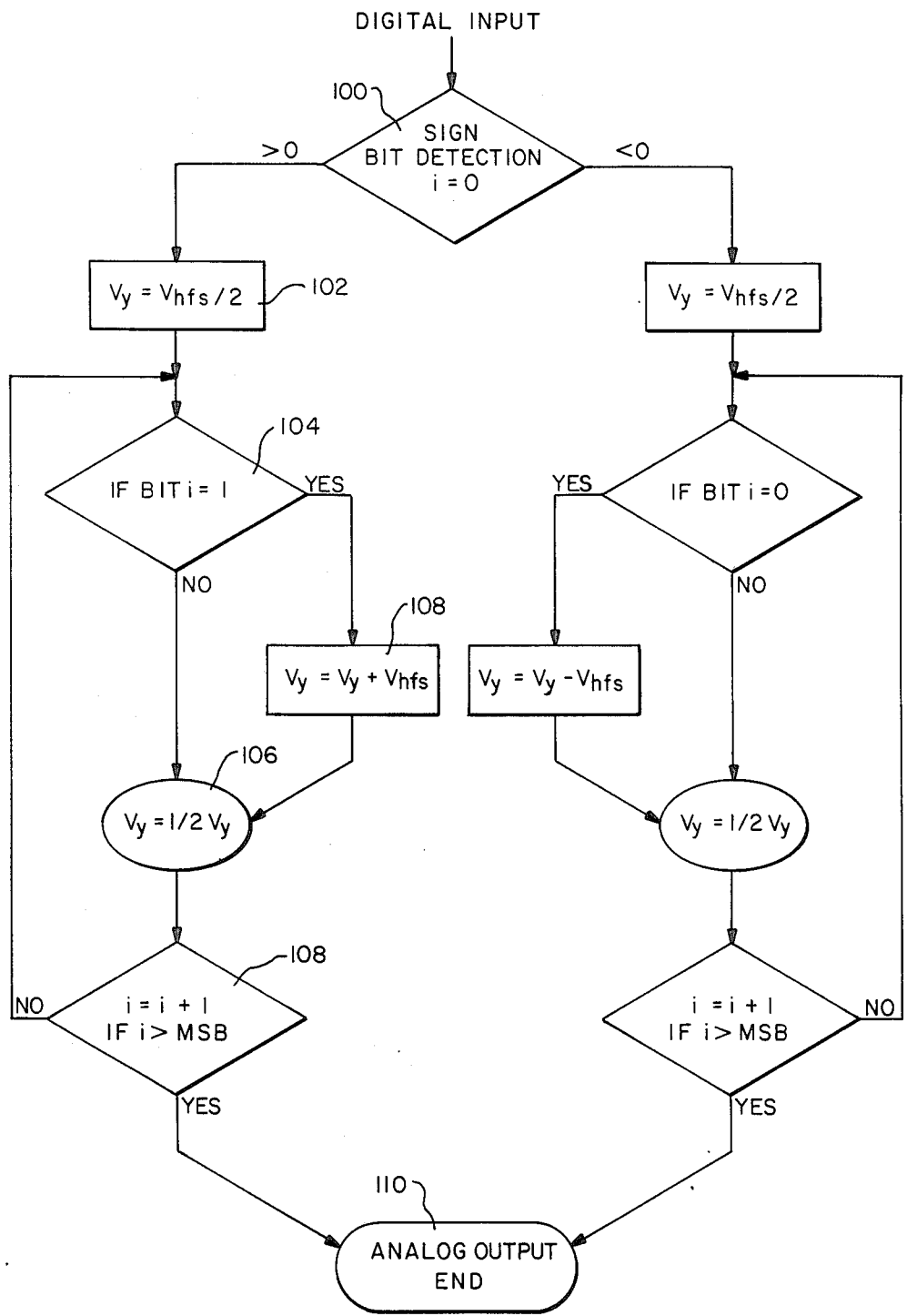
FIG. 3 is a flow diagram for digital-to-analog conversion.

Flow charts showing the cyclic or algorithmic conversion technique of the present invention are depicted in FIGS. 2 and 3. For analog-to-digital conversion (FIG. 2), first the sign of the analog input voltage $V_{in}$ is detected by block 80 by methods known in the art, and $V_{in}$ is designated $V_X$ for purposes of the algorithm. If the sign is positive ($V_X > 0$) the left hand portion of the algorithm is selected and the sign bit is set to one. Then the reference voltage which is designated $V_{ref}$ in FIG. 1 and which is equal to the half full scale voltage, or $V_{hfs}$, is subtracted from $V_X$ (Block 84). If the result is greater than zero the most significant bit is set to one (Block 86) and the difference is multiplied by two (Block 90). If the difference is less than zero the reference voltage $V_{vfs}$ is added back to the difference to arrive at the original $V_X$ (Block 88), which original $V_X$ is multiplied by two (Block 90). The bit position is decremented (Block 92) until all the positions including the last position, which is the least significant bit (LSB), are filled. The right hand portion of the flow chart shows a similar technique when the sign of $V_{in}$ is negative. In this situation, $-V_{vfs}$ is used as $V_{ref}$.

For digital-to-analog conversion (FIG. 3), after the sign bit is detected by techniques known in the art (Block 100), and assuming it is positive, the reference voltage $V_{hfs}$ is divided by two and designated $V_Y$ (Block 102). If the bit in the least significant position is set to one (Block 104), then the reference voltage $V_{hfs}$ is added to $V_Y$ (Block 108) and the result is divided by two (Block 106). If the bit is not set, then $V_Y$ is divided by two (Block 106). This algorithm repeats itself (Block 108) until the most significant bit is processed. Again if the sign bit is negative, the right portion of the algorithm of FIG. 3 is used. Again $-V_{hfs}$ is used as $V_{ref}$ in this situation.

Incorporating the algorithm of FIG. 2 with FIG. 1 and the control sequence for analog-to-digital conversion in Table I, the operation of the analog-to-digital converter 10 (FIG. 1) of the invention for positive values of $V_{in}$ is as follows.

Initially the $V_{in}/2$ analog signal and the inverted $V_{in}/2$ signal are sampled on capacitors $C_3$, $C_3'$ by closing switch $S_{14}$ to ground and closing switch $S_0$. $V_{in}$ is designated $V_X$. After this is accomplished, capacitor $C_4$, $C_4'$ is cleared by closing switch $S_{16}$ (cycle 1). The reference signal $V_{ref}/2$, $-V_{ref}/2$ (which is equivalent to the voltage of half full scale) is sampled on capacitors $C_1$, $C_1'$ respectively by closing switches $S_2$, $S_5$. Next the capacitors $C_2$, $C_2'$ are cleared by closing switch $S_9$ (cycle 2). The reference voltage is transferred to capacitors $C_2$, $C_2'$ from capacitors $C_1$, $C_1'$ by closing switches $S_4$, $S_8$. Then the input voltage $V_X$ is transferred to capacitors $C_4$, $C_4'$ from capacitors $C_3$, $C_3'$ by closing switches $S_{13}$ and $S_{15}$ (cycle 3). $V_{ref}$ is then sampled on capacitors $C_3$, $C_3'$ from capacitors $C_2$, $C_2'$ by closing switches $S_{11}$, $S_{14}$. The $V_X$ is sampled on capacitors $C_1$, $C_1'$ from capacitors $C_4$, $C_4'$ by closing switches $S_{18}$, $S_3$, and $S_5$ (cycle 4). Next in cycle 5 of the control sequence, capacitors $C_2$, $C_2'$ are cleared by closing switch $S_9$. At the same time the top plate potential of capacitors $C_5$, $C_5'$ are set by closing switches $S_6$, $S_8'$ and which stay closed until cycle 7. Capacitors $C_4$, $C_4'$ are cleared by closing $S_{16}$. In cycle 6, $V_{ref}$ is transferred to capacitors $C_4$, $C_4'$ from capacitors $C_3$, $C_3'$ by closing switches $S_{13}$ and $S_{15}$. In cycle 7, $V_X$ is transferred to capacitors $C_2$, $C_2'$ from capacitors $C_1$, $C_1'$ by closing switches $S_4$, $S_8$ and $V_{ref}$ is subtracted from capacitors $C_2$, $C_2'$ through capacitors $C_5$, $C_5'$ by closing switches $S_7$, $S_{18}$, $S_8'$ and opening $S_6$. The sign of the resulting value is then compared in comparator 33 by closing switch $S_{10}$. If this value is greather than zero a 1 bit is set in the most significant bit location. If this value is less than zero, the charge on $C_2$ is restored to its original value (cycle 8) by closing switch $S_6$ and opening $S_7$. If this occurs, and thus the value is less than zero, a zero is placed in the most significant bit location. Next in cycle 9, the $V_{ref}$ on capacitors $C_1$, $C_1'$ is sampled from $C_4$, $C_4'$ by closing switches $S_{18}$, $S_3$, $S_5$. The value on capacitors $C_2$, $C_2'$ is sampled on capacitors $C_3$, $C_3'$ by closing switches $S_{11}$, $S_{15}$, $S_{16}$. The voltage on capacitors $C_3$, $C_3'$ is then multiplied by two and transferred to $C_4$, $C_4'$ by closing switch $S_{12}$, opening switch $S_{16}$ and opening switch $S_{11}$ (cycle 10). Thus a doubling of remainders is accomplished by sampling and reversing the input path on capacitors $C_3$, $C_3'$ using a switch capacitor technique. The value on capacitors $C_2$, $C_2'$ is cleared by closing switch $S_9$ (cycle 11). Next the value $V_{ref}$ is transferred to capacitors $C_2$, $C_2'$ from capacitors $C_1$, $C_1'$ by closing switches $S_4$, $S_8$. At this point the algorithm repeats itself in order to determine the remaining bits by going back to the steps of cycle 4 and continuing until all the bits have been determined.

Incorporating the algorithm of FIG. 3 with FIG. 1 and the control sequence for digital-to-analog conversion as shown in Table 2, the operation of the digital-to-analog converter of the invention for positive values is as follows:

Initially, the mid-rise half value of the least significant bit (LSB) is sampled on capacitors $C_3$, $C_3'$ by closing switches $S_1$ and $S_{14}$. The mid-rise half least significant bit voltage is the half full scale voltage. Then the capacitors $C_4$, $C_4'$ are cleared by closing switch $S_{16}$, and the reference voltage $V_{ref}$ is sampled on capacitors $C_1$, $C_1'$ by closing swtiches $S_2$ and $S_5$. This time the $V_{ref}$ voltage is equivalent to the negatives of the half full-scale voltage. Then the capacitors $C_2$, $C_2'$ are cleared by closing switch $S_9$. This completes the first cycle of the digital-to-analog conversion.

In the second cycle, the reference voltage, $V_{ref}$, is transferred to capacitors $C_2$, $C_2'$ by closing switches $S_4$, $S_8$. Then $V_Y$ is transferred to capacitors $C_4$, $C_4$, by closing switches $S_{14}$ and $S_{15}$. $V_Y$ is then sampled on capacitors $C_1$, $C_1'$ from capacitors $C_4$, $C_4'$ by closing switches $S_{18}$, $S_3$, and $S_{16}$. Then $V_{ref}$ is then sampled on capacitors $C_3$, $C_3'$ from capacitors $C_2$, $C_2'$ by closing switches $S_{11}$, $S_{15}$, and $S_{16}$. The reference is then multiplied by two and transferred to $C_4$, $C_4'$ by closing switch $S_{12}$ and opening switch $S_{16}$ and opening switch $S_{11}$. The reason that this is accomplished is that the ratio of the capacitor $C_3$ over the capacitor $C_4$ is one half, and it is desired that the reference not be halved at this point but put through at a full value which is a value of half full scale voltage.

In cycle 3, capacitors $C_2$, $C_2'$ are cleared by closing switch $S_9$ and capacitor $C_5$, $C_5'$ has its top plate potential set by closing switches $S_8'$, $S_6$.

In cycle 4, $V_Y$ is transferred to capacitors $C_2$, $C_2'$ from capacitors $C_1$, $C_1'$ by closing switches $S_4$, $S_8$. At this point if the input bit, which for the first pass through this algorithm as the least significant bit, is 1, the $V_{ref}$ is subtracted from the $V_Y$ in the capacitors $C_2$, $C_2'$ through capacitors $C_5$, $C_5'$ by closing switches $S_7$, $S_{18}$ (which means $V_{hfs}$ is added to $V_Y$. If the bit is not a 1, this addition does not occur. The control unit 34 senses the value of the bits in order to decide which switches to open and close.

In cycle 5, the $V_{ref}$ is sampled on capacitors $C_1$, $C_1'$ from capacitors $C_4$, $C_4'$ by closing switches $S_{18}$, $S_3$, and $S_5$. $V_Y$ is sampled on capacitors $C_3$, $C_3'$ from capacitors $C_2$, $C_2'$ by closing switches $S_{12}$, $S_{14}$. Then capacitors $C_2$, $C_2'$ and $C_4$, $C_4'$ are cleared by closing switches $S_9$ and $S_{16}$ respectively. At this point the algorithm repeats itself by returning to cycle 2 to process the next bit. This algorithm repeats itself until the most significant bit has been processed and the digital-to-analog conversion has been accomplished. The analog output is available at the output of device 31. Again it is to be remembered that both with the control sequence shown in Table 1 and Table 2, that the control unit 34 which controls this functions could be provided by one of ordinary skill in the art.

From the above it can be seen that the present invention accounts for and corrects gain errors by circulating the reference voltage so that both the signal and the reference voltage have the same error, which error is cancelled when the signal and the reference voltage are combined.

Other advantages, and objects of the invention can be obtained from a review of the figures and appended claims. It is to be understood that other embodiments of the present invention can be developed and still come within the scope and spirit of the appended claims.

TABLE I

| | Analog-to-Digital Converter's Control Sequence | |
|---|---|---|
| CYCLE | FUNCTION | SWITCHES CLOSED |
| 1 | Sample the input signal $(+V_X/2, -V_X/2)$ on $C_3$, $C_3'$ | $S_0$, $S_{14}$ |
| | Clear the $C_4$, $C_4'$ | $S_{16}$ |
| 2 | Sample the Reference $(+V_{ref}/2, -V_{ref}/2)$ on $C_1$, $C_1'$ | $S_2$, $S_5$ |
| | Clear the $C_2$, $C_2'$ | $S_9$ |
| 3 | Transfer $V_{ref}$ to $C_2$, $C_2'$ from $C_1$, $C_1'$ | $S_4$ $S_8$ |
| | Transfer $V_X$ to $C_4$ $C_4'$ from $C_3$, $C_3'$ | $S_{13}$ $S_{15}$ |
| 4 | Sample $V_{ref}$ on $C_3$, $C_3'$ from $C_2$ $C_2'$ | $S_{11}$ $S_{14}$ |
| | Sample $V_X$ on $C_1$, $C_1'$ from $C_4$ $C_4'$ | $S_{18}$ $S_3$ $S_5$ |
| 5 | Clear $C_2$, $C_2'$ | $S_9$ |
| | Clear $C_4$, $C_4'$ | $S_{16}$ |
| | Set $C_5$, $C_5'$ top plate potential | $S_6$ $S_8'$ |
| 6 | Transfer $V_{ref}$ to $C_4$, $C_4'$ from $C_3$, $C_3'$ | $S_{13}$ $S_{15}$ |
| 7 | Transfer $V_X$ to $C_2$, $C_2'$ from $C_1$, $C_1'$ | $S_4$ $S_8$ |
| | and Substract $V_{ref}$ from $C_2$ $C_2'$ through $C_5$, $C_5'$ | $S_7$ $S_{18}$ $S_8'$ |
| | Determine sign with comparator | $S_{10}$ |
| 8 | Restore the charge if needed | $S_6$ |
| 9 | Sample $V_{ref}$ on $C_1$, $C_1'$ from $C_4$, $C_4'$ | $S_{18}$ $S_3$ $S_5$ |
| 10 | Sample the remainder on $C_3$, $C_3'$ thru $(C_2, C_2')$ | $S_{11}$ $S_{15}$ $S_{16}$ |
| | Multiply the remainder by 2 & transfer the charge to $C_4$, $C_4'$ | $S_{12}$ (open $S_{16}$, open $S_{11}$) (inverse) |
| 11 | Clear $C_2$, $C_2'$ | $S_9$ |
| 12 | Transfer $V_{ref}$ to $C_2$, $C_2'$ from $C_1$, $C_1'$ | $S_4$ $S_8$ |

TABLE I-continued

Analog-to-Digital Converter's Control Sequence

| CYCLE | FUNCTION | SWITCHES CLOSED |
|---|---|---|
| | Continue the remaining bits by going back to Cycle 4 | |

TABLE II

Digital-to-Analog Converter's Control Sequence

| CYCLE | FUNCTION | SWITCHES CLOSED |
|---|---|---|
| 1 | Sample the mid-rise half LSB ($+V_y/2$, $-V_y/2$) on $C_3$, $C_3'$ ($V_y = V_{hfs}/2$) | $S_1$ $S_{14}$ |
| | Clear the $C_4$, $C_4'$ | $S_{16}$ |
| | Sample in the reference ($+V_{ref}/2$, $-V_{ref}/2$) on $C_1$, $C_1'$ | $S_2$ $S_5$ |
| | Clear the $C_2$, $C_2'$ | $S_9$ |
| 2 | Transfer $V_{ref}$ to $C_2$, $C_2'$ | $S_4$ $S_8$ |
| | Transfer $V_y$ to $C_4$, $C_4'$ | $S_{13}$ $S_{15}$ |
| | Sample $V_y$ on $C_1$, $C_1'$ from $C_4$, $C_4'$ | $S_{18}$ $S_3$ $S_{16}$ |
| | Sample $V_{ref}$ on $C_3$, $C_3'$ from $C_2$, $C_2'$ | $S_{11}$ $S_{15}$ $S_{16}$ |
| | Multiply the reference by two and transfer to $C_4$, $C_4'$ (Since $C_3/C_4$ is one-half the actual factor for the reference is unity) | $S_{12}$ open $S_{16}$ open $S_{11}$ |
| 3 | Clear $C_2$, $C_2'$ | $S_9$ |
| | Set $C_5$ $C_5'$ top plate potential | $S_8'$ $S_6$ |
| 4 | Transfer $V_y$ to $C_2$, $C_2'$ from $C_1$, $C_1'$ | $S_4$ $S_8$ |
| | If the input digital bit is one | |
| | Add $V_{ref}$ to $C_2$ $C_2'$ through $C_5$ $C_5'$ | $S_7$ $S_{18}$ |
| | Otherwise do not add | |
| 5 | Sample $V_{ref}$ on $C_1$, $C_1'$ | $S_{18}$ $S_3$ $S_5$ |
| | Sample the $V_y$ on $C_3$, $C_3'$ from $C_2$, $C_2'$ | $S_{12}$ $S_{14}$ |
| 6 | Clear $C_2$ | $S_9$ |
| | Clear $C_4$ | $S_{16}$ |
| | Continue with the remaining bits by going back to Cycle 2 | |

I claim:

1. An apparatus for analog-to-digital signal conversion and for digital-to-analog signal conversion comprising:
first means for sampling, holding, and amplifying a signal;
second means for sampling, holding, and amplifying a signal;
third means for communicating the output of the first means to the input of the second means and the output of the second means to the input of the first means;
fourth means for introducing an input signal to be converted to one of said first means and said second means;
fifth means for introducing a reference signal to be combined with the input signal to one of said first means and said second means;
control means circulating said input signal, to be converted, from one of the first means and the second means, to the other of said first means and the second means, and for circulating said reference signal, to be combined with the input signal, from one of the first means and the second means, to the other of said first means and the second means, and for combining said signals.

2. The apparatus of claim 1 wherein said means for introducing an input signal inputs said signal to one of said first and second means and the means for introducing a reference signal inputs said reference signal to the other of said first and second means.

3. The apparatus of claim 1 including a comparator communicating with said third means.

4. The apparatus of claim 1 wherein said control means can circulate said input signal through both the first means and the second means and can circulate the reference signal between both the first means and the second means so that both the input signal and the reference signal are similarly modified by the first and second means preparatory to the combination of the input and reference signal.

5. An apparatus for analog-to-digital signal conversion comprising:
first means for sampling, holding and amplifying a signal;
second means for sampling, holding and amplifying a signal;
third means for connecting the output of the first means to the input of the second means and for connecting the output of the second means to the input of the first means;
fourth means for introducing an input analog signal to be converted to a digital signal to one of said first and said second means;
fifth means for introducing a reference signal to be combined with the analog input signal to the other of said first and second means;
control means for circulating said analog input signal to be converted, and said reference signal to be combined with the analog input signal, through and between the first and second means and for combining said signals.

6. An apparatus for digital-to-analog signal conversion comprising:
first means for sampling, holding and amplifying a signal;
second means for sampling, holding and amplifying a signal;
third means for connecting the output of the first means to the input of the second means and for connecting the output of the second means to the input of the first means;
fourth means for introducing an input digital signal to be converted to an analog signal;
fifth means for introducing a reference signal to one of said first and second means;

control means for receiving said input digital signal to be converted, and for circulating said reference signal through and between the first and second means.

7. The apparatus of claim 6 wherein:
said digital input signal is provided to said control means;
and including sixth means introducing a second reference signal proportional to the value of the digital input signal to the other of the first and second means.

8. The apparatus of claim 7 wherein said control means is additionally for circulating said second reference signal through and between the first and second means and for combining said reference signal and said second reference signal.

9. The apparatus of claim 7 wherein said control means provides for combining the reference signal and the second reference signal if the digital signal is one, and for not combining the reference signal and the second reference signal if the digital signal is zero.

10. The apparatus of claim 7 wherein said second reference signal is substantially equivalent to the mid-rise half value of the reference signal.

11. An apparatus for analog-to-digital signal conversion and for digital-to-analog signal conversion comprising:
first means for sampling, holding, and amplifying a signal, wherein said first means includes an amplifier, a first capacitor communicating with an input to the amplifier and a second capacitor connected between the input to the amplifier and the first capacitor, and an output from the amplifier;
second means for sampling, holding and amplifying a signal;
third means for communicating the output of the first means to the input of the second means and the output of the second means to the input of the first means;
fourth means for introducing an input signal to be converted to one of said first means and said second means;
fifth means for introducing a reference signal to be combined with the input signal to one of said first means and said second means;
control means for circulating said input signal, to be converted, from one of the first means and the second means, to the other of said first means and the second means, and for circulating said reference signal, to be combined with the input signal, from one of the first means and the second means, to the other of said first means and the second means, and for combining said signals.

12. An apparatus for analog-to-digital signal conversion comprising:
first means for sampling, holding and amplifying a signal, wherein said first means includes a first amplifier with a first capacitor connected to the input of the first amplifier and a second capacitor connected between the input and the output of the first amplifier;
second means for sampling, holding and amplifying a signal, wherein said second means includes a second amplifier with a third capacitor connected to the input of the second amplifier and a fourth capacitor connected between the input and the output of the second amplifier;
third means for connecting the output of the first means to the input of the second means and for connecting the output of the second means to the input of the first means, wherein said connecting means includes a first line means for connecting the output of the first amplifier to the third capacitor and a second line means for connecting the output of the second amplifier to the first capacitor;
fourth means for introducing an analog input signal to be converted to a digital signal to one of said first and said second means;
control means for circulating said analog input signal to be converted, and said reference signal to be combined with the analog input signal, through and between the first and second means and for combining said signals.

13. The apparatus of claim 12 including:
a comparator communicating with the first line means.

14. An apparatus for digital-to-analog signal conversion comprising:
first means for sampling, holding and amplifying a signal, wherein said first means includes a first amplifier with a first capacitor connected to the input of the first amplifier and a second capacitor connected between the input and the output of the first amplifier;
second means for sampling, holding and amplifying a signal, wherein said second means includes a second amplifier with a third capacitor connected to the input of the second amplifier and a fourth capacitor connected between the input and the output of the second amplifier;
third means for connecting the output of the first means to the input of the second means and for connecting the output of the second means to the input of the first means, wherein said third connecting means includes a first line means for connecting the output of the first amplifier to the third capacitor and a second line means for connecting the output of the second amplifier to the first capacitor;
fourth means for introducing an digital input signal to be converted to an analog signal to one of the first and second means;
fifth means for introducing a reference signal to one of said first and second means;
control means for receiving said digital input signal to be converted, and for circulating said reference signal through and between the first and second means.

15. An apparatus for analog-to-digital signal conversion and for digital-to-analog signal conversion comprising:
first means for sampling, holding, and amplifying a signal;
second means for amplifying a signal;
third means for communicating the output of the first means to the input of the second means;
fourth means for introducing an input signal to be converted to said first means;
control means for transferring said input signal to be converted from the first means to the second means;
fifth means for introducing a reference signal to be combined with the input signal to said first means after the input signal is transferred to the second means;
said control means for transferring said reference signal from the first means to the second means and for combining the input signal and the reference signal.

* * * * *